United States Patent
Marconi et al.

(10) Patent No.: US 9,007,562 B2
(45) Date of Patent: Apr. 14, 2015

(54) EXTREME ULTRAVIOLET/SOFT X-RAY LASER NANO-SCALE PATTERNING USING THE DEMAGNIFIED TALBOT EFFECT

(71) Applicants: Colorado State University Research Foundation, Fort Collins, CO (US); Synopsys, Inc., Mountain View, CA (US)

(72) Inventors: Mario C. Marconi, Fort Collins, CO (US); Lukasz Urbanski, Fort Collins, CO (US); Jorge J. Rocca, Fort Collins, CO (US); Artak Isoyan, Beaverton, OR (US)

(73) Assignees: Colorado State University Research Foundation, Fort Collins, CO (US); Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/871,879

(22) Filed: Apr. 26, 2013

(65) Prior Publication Data
US 2014/0023973 A1    Jan. 23, 2014

Related U.S. Application Data

(60) Provisional application No. 61/638,760, filed on Apr. 26, 2012.

(51) Int. Cl.
G03B 27/52     (2006.01)
G03F 7/20      (2006.01)

(52) U.S. Cl.
CPC ............ *G03F 7/2053* (2013.01); *G03F 7/2047* (2013.01); *G03F 7/7035* (2013.01)

(58) Field of Classification Search
USPC ................................................ 355/55, 44, 77
See application file for complete search history.

(56) References Cited

PUBLICATIONS

Macchietto et al., "Generation of a millijoule-level soft-x-ray laser pulses at a 4-Hz repetition rate in a highly saturated tabletop capillary discharge amplifier", Optics Letters, Aug. 15, 1999, pp. 1115-1117, vol. 24, No. 16.
Isoyan et al., "Talbot Lithography: Self-imaging of complex structures", Nov./Dec. 2009, pp. 2931-2937, vol. 27, No. 6, J. Vac. Sci. Technol.
W. Duane Montgomery, "Self-Imaging Objects of Infinite Aperture", Journal of the Optical Society of America, Jun. 1967, pp. 772-778, vol. 57, No. 6.
Wachulak et al., "Nanoscale patterning in high resolution HSQ photoresist by interferometric lithography with tabletop extreme ultraviolet lasers", pp. 2094-2097, vol. 25, No. 6, Nov./Dec. 2007, J. Vac. Sci. Technol.

*Primary Examiner* — Brittany Raymond
(74) *Attorney, Agent, or Firm* — Samuel M. Freund; Cochran Freund & Young LLC

(57) ABSTRACT

An apparatus and method for nanopatterning of substrates using the demagnified Talbot effect, wherein: (a) large arrays of nanostructures can rapidly be printed; (b) short extreme ultraviolet wavelengths permits sub-100 nm spatial resolution; (c) the de-magnification factor can be continuously adjusted, that is, continuously scaled; (d) the patterning is the effect of the collective diffraction of numerous tiled units that constitute the periodic array, giving rise to error resistance such that a defect in one unit is averaged over the area of the mask and the print does not show any defects; (e) the Talbot mask does not wear out since the method is non-contact; and (f) the feature sizes on the mask do not have to be as small as the feature sizes desired on the target, are described. The apparatus includes a source of coherent radiation having a chosen wavelength directed onto a focusing optic, the reflected converging light passing through a Talbot mask and impinging on a target substrate.

7 Claims, 3 Drawing Sheets

EXTREME ULTRAVIOLET/SOFT X-RAY LASER NANO-SCALE PATTERNING USING THE DEMAGNIFIED TALBOT EFFECT

RELATED CASES

The present patent application claims the benefit of Provisional Patent Application Ser. No. 61/638,760 filed on 26 Apr. 2012 for "Non-Contact, Scalable and Defect Free Optical Nano-patterning by Demagnified Talbot Effect" by Mario C. Marconi et al., the disclosure and teachings of which are hereby incorporated by reference herein.

STATEMENT REGARDING FEDERAL RIGHTS

This invention was made with government support from the National Science Foundation under Grant Numbers ECCS-0901806 and EEC-0310717. The government has certain rights in the invention.

FIELD OF THE INVENTION

Embodiments of the present invention relate generally to printing arrays of nano-scale structures using an illuminated Talbot mask and, more particularly, to illuminating a Talbot mask with convergent coherent light such that the Talbot image is demagnified, thereby enabling printing of arrays of nanostructures having dimensions smaller than those present in the mask.

BACKGROUND OF THE INVENTION

The ability to print nano-scale structures in a cost effective and convenient way will enable more rapid advances in nanotechnology. As examples, fabrication of templates for memory chips, surface enhanced Raman scattering detectors, and arrays of nano-antennas would benefit from such advances.

SUMMARY OF THE INVENTION

Embodiments of the present invention overcome the disadvantages and limitations of prior art by providing an apparatus and method for printing arrays of unit cells or tiles having nanometer dimensions in the surface of a photoresist.

Another object of embodiments of the invention is to provide an apparatus and method for printing arrays of unit cells or tiles having nanometer dimensions in the surface of a photoresist by illuminating a Talbot mask with a coherent beam of extreme ultraviolet light.

Yet another object of embodiments of the invention is to provide an apparatus and method for printing arrays of unit cells or tiles having nanometer dimensions in the surface of a photoresist by illuminating a Talbot mask with a coherent beam of extreme ultraviolet light, such that the feature sizes on the mask do not have to be as small as the feature sizes desired on the target.

Still another object of embodiments of the invention is to provide an apparatus and method for printing arrays of unit cells or tiles having nanometer dimensions in the surface of a photoresist by illuminating a Talbot mask with a coherent beam of extreme ultraviolet light, such that the feature sizes on the mask do not have to be as small as the feature sizes desired on the target substrate, and unit cell averaging eliminates or at least substantially reduces the number of mask defects transferred onto the target.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purposes of the present invention, as embodied and broadly described herein, the apparatus for producing nanometer-scale patterning on the surface of a sample hereof includes: a light source for generating a coherent light beam having a chosen wavelength; a focusing optic into which the light beam from the light source is directed, for causing the light beam emerging therefrom to converge; and a Talbot mask having a periodic pattern of nanometer-scale unit cells formed thereon, the Talbot mask disposed in the converging light beam from the focusing optic at a first chosen distance from the focusing optic such that the converging light beam passes therethrough; the sample being disposed at a second chosen distance from the Talbot mask, and having a photosensitive surface thereon responsive to the light beam passing through the Talbot mask, for generating a nanostructure having the pattern of unit cells of the Talbot mask on the sample.

In another aspect of the present invention, and in accordance with its objects and purposes, the method for producing nanometer-scale patterning on the surface of a sample hereof includes: directing a coherent light beam having a chosen wavelength onto a focusing optic such that the light beam emerging therefrom converges; placing a Talbot mask having a periodic pattern of nanometer-scale unit cells formed thereon in the converging light beam at a first chosen distance from the focusing optic, wherein the converging light beam passes through the Talbot mask; and placing the sample at a second chosen distance from the Talbot mask, the having a photosensitive surface thereon responsive to the light beam passing through the Talbot mask, for generating a nanostructure having the pattern of unit cells of the Talbot mask on the sample.

Benefits and advantages of the present invention include, but are not limited to, an apparatus and method for nanopatterning of substrates using the demagnified Talbot effect such that: (a) large arrays of nanostructures can rapidly be printed; (b) short extreme ultraviolet wavelengths permits sub-100 nm spatial resolution; (c) the de-magnification factor can be continuously adjusted, that is, continuously scaled; (d) the patterning is the effect of the collective diffraction of numerous tiled units that constitute the periodic array, giving rise to error resistance such that a defect in one unit is averaged over the area of the mask wherein the print does not show any defects; (e) the Talbot mask does not wear out since the method is non-contact; and (f) the feature sizes on the mask do not have to be as small as the feature sizes desired on the target substrate.

BRIEF DESCRIPTION OF THE DRAWINGS

The accompanying drawings, which are incorporated in and form a part of the specification, illustrate embodiments of the apparatus of the present invention and, together with the description, serve to explain the principles of the invention. In the drawings.

DETAILED DESCRIPTION OF THE INVENTION

Embodiments of the nano-scale printing technology of the present invention demonstrate that arrays of units cells (or tiles) with nanometer dimensions can be printed in the surface of a photoresist by illuminating a mask with a coherent beam of extreme ultraviolet laser light. A generalization of the classical self-imaging Talbot effect, where the periodic structure was a series of lines, to the printing of complex images (tiles having arbitrary designs) arranged in a square matrix is described in "Nanometer scale Talbot patterning with a table top soft X-ray (EUV) laser," by A. Isoyan et al., Journal of Vacuum Science and Technology B, B27, 2931-2936, (2009), by which a periodic structure illuminated by a coherent light beam is reproduced at certain planes located at distances equal to multiples of a defined distance known as the "Talbot distance", produces self-images at these locations which are the product of the collective contribution of the diffraction of the individual cells (or tiles) in the mask. The distance between the sample and the mask is determined by the periodicity of the mask and the wavelength according the relationship:

$$z_{nT} = \frac{n2p^2}{\lambda},$$

where n is the dimensionless Talbot plane order, p is the periodicity (distance) of the tiling in the mask and $\lambda$ is the wavelength of illumination. The invention enables printing of arrays of nanostructures having dimensions approximately 85% the size of the structures present in the mask (about 15% smaller). In accordance with embodiments of the present invention, demagnification of the Talbot image is achieved by illuminating the Talbot mask with a convergent coherent light beam in place of a collimated light beam.

Figure 1:
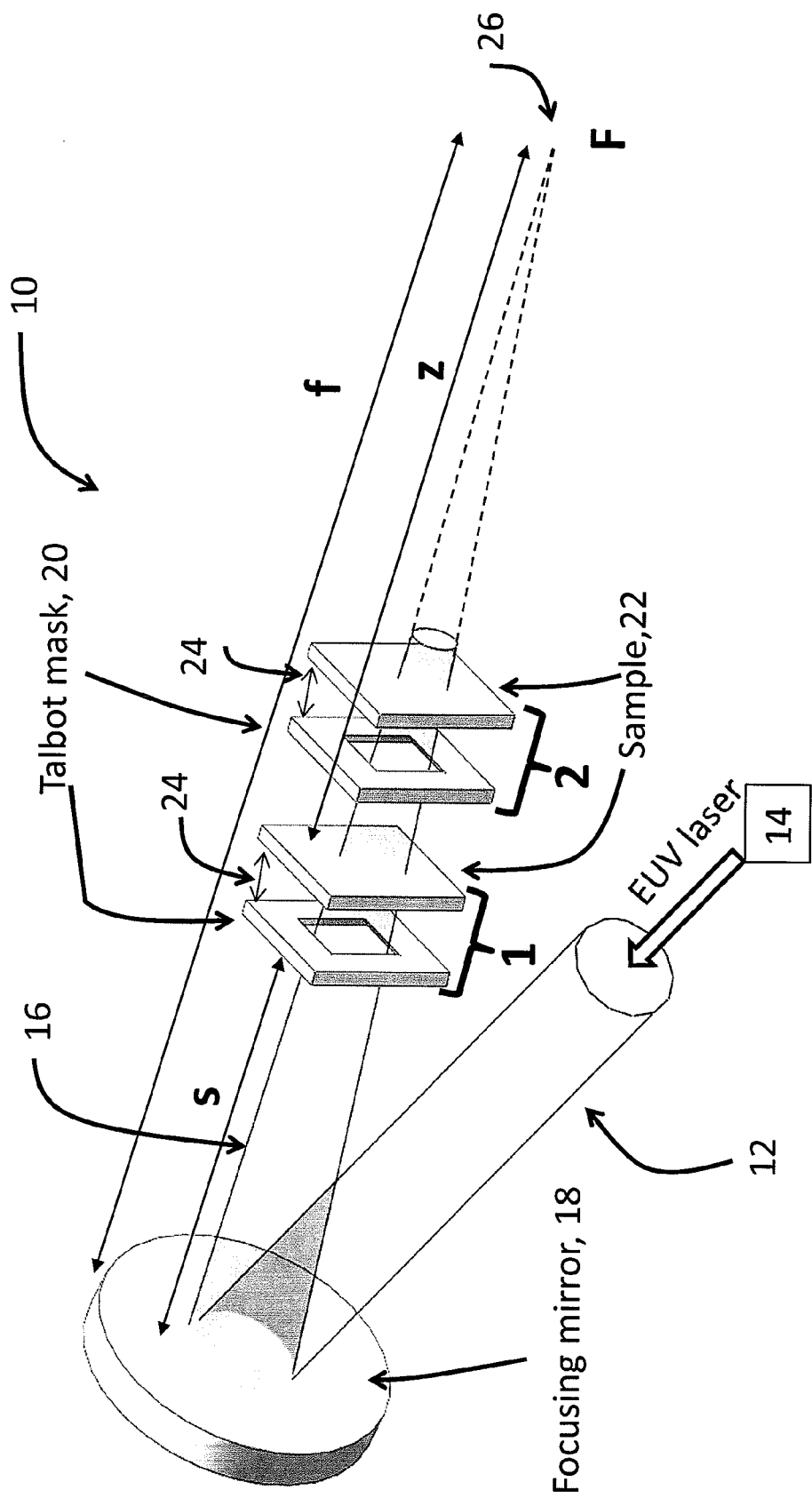
FIG. 1 is a schematic representation of a perspective view of an embodiment of apparatus of the present invention, showing a coherent light beam having a chosen wavelength being directed onto a focusing optic, illustrated as a spherical mirror in FIG. 1, the reflected converging light passing through a Talbot mask and impinging on a target sample.

Reference will now be made in detail to the present embodiments of the invention, examples of which are illustrated in the accompanying drawings. In the FIGURES, similar structure will be identified using identical reference characters. It will be understood that the FIGURES are for the purpose of describing particular embodiments of the invention and are not intended to limit the invention thereto. Turning now to FIG. 1, a schematic representation of a perspective view of an embodiment of apparatus, 10, of the present invention, showing laser beam, 12, having a chosen wavelength and generated by light source, 14, being directed onto focusing optic, 18, illustrated in FIG. 1 as a spherical mirror, but could also be a lens or other optical device as would be known to one having skill in the art at the time the invention was made. The wavelength of the laser may be varied, typically from about 8 nm to approximately 47 nm, the range were coherent light sources having sufficient energy for developing photoresists are presently available. Shorter wavelengths are generally better suited for reproduction of smaller mask features, with wavelengths of ≤50 nm being useful for nanometer-scale mask features (generally between about 1 nm and about 100 nm). Although responses of various photoresist materials are only weakly dependent on wavelength, for wavelengths below about 50 nm, most photoresists are sensitive. Typical photoresist materials that may be used include polymethylmethacrylate (PMMA) and hydrogen silsesquioxane (HSQ); however, there are many commercially available proprietary compositions.

The relevant parameters for the illuminating light beam are wavelength, which determines the resolution of the printed features, and spatial coherence, which determines the area that can be printed. Spatial coherence is characterized or defined in terms of the "coherence area" or "coherence radius". A "coherence area" larger or equal to the area of the Talbot mask (or an equivalent "coherence radius" equal or larger than W/2, with W the size of the mask) is required for Talbot imaging.

The focal distance of the focusing optic may be varied, with typical values being between about 25 cm and 1 m. When a spherical mirror is employed, the mirror simultaneously serves as wavelength filter and produces a convergent illumination beam. That is, the reflectivity of the mirror is adjusted to peak in the vicinity of the incident laser wavelength, and partially rejects background continuum from the plasmas that are the active media of the extreme ultraviolet (EUV) lasers employed. Mirror coatings are designed specifically for each wavelength; for example, at 47 nm Si/Sc is used while at 13 nm, Si/Mo provides beneficial results.

In other embodiments (such as use of a focusing lens in place of a spherical mirror), the addition of a wavelength filter may be beneficial, but is not necessary, and will reduce background noise at other wavelengths. As one having skill in the art will understand, the need to improve the signal-to-noise ratio of the laser beam will depend on several factors, including the background noise intrinsic to the laser used and the sensitivity of the photoresist to the background wavelengths for photoresist processing.

Converging laser beam 16 is directed by focusing optic 18 onto Talbot mask, 20, and, after passing through mask 20, onto sample target, 22, where arrays disposed on mask 20 are to be printed. A Talbot mask is a semi-transparent structure constructed of materials chosen depending on the intended wavelength of use, having a periodic tiled pattern formed therein, using standard electron beam lithography, as an example. The periodic tiled structure is chosen to be as opaque as possible to the incident light, while the supporting membrane or other structure is chosen to be as transparent as possible thereto. An example for 47 nm light is a cured, opaque photoresist material disposed on a silicon nitrate membrane between about 25 nm and approximately 30 nm. For shorter wavelengths (approximately 10 nm), an approximately 100 nm thick silicon nitrate membrane (transparent) with about 50 nm chromium (opaque) for the tiles, may be used.

Typically, target 22 is coated with a photosensitive material such as a photoresist, with PMMA or HSQ being examples, and is located behind Talbot mask 20 is generally separated from mask 20 by a distance, 24, corresponding to a Talbot plane. There are an infinite number of Talbot planes which could be selected and the operation of embodiments of the invention encompasses any choice of Talbot plane. However, as the distance between Talbot mask 20 and target 22 increases, the numerical aperture and resolution both decrease. Although the demagnification factor increases slightly with higher order Talbot planes, this effect is generally offset by the decrease in resolution. For these reasons, typically the target will be placed at the first Talbot plane. The location of the Talbot planes is determined by the above formula for $z_{nT}$.

The present invention is not limited to the basic Talbot effect but can also exploit what is known as the "fractional" Talbot effect or Montgomery effect (See, e.g., W. Montgomery, "Self-Imaging Objects of Infinite Aperture," J. Opt. Soc. Am. 57, 772-775(1967)) by placing the target at specific fractions of Talbot intervals. The Montgomery effect permits objects having two different periodic structures embedded in a single array to replicate themselves at distances that are fractions of the traditional Talbot distance. By exploiting the Montgomery effect, it is possible to adjust the periodicity of the images produced by the Talbot mask. At the Talbot distance, the image has the same periodicity as that of the features of the mask. For fractional Talbot distances, the image has a periodicity that is a multiple of the original periodicity of the mask. However, the contrast is diminished, and for printing purposes it may be a limitation (insufficient intensity difference between black and bright regions). The use of this effect depends on the design of the tiles. As the Montgomery effect is a well understood optical phenomenon, those having skill in the art will understand the relationships between possible fractions of Talbot intervals and the resulting effect on the periodicity. For example, double period images are obtained between the Talbot distances at both one quarter and three quarters of a Talbot length (also referred to as Talbot interval). Aligning the sample at either of these intervals therefore allows the possibility to double the period.

The mask-sample combination 20-22 may be placed along the path of converging beam 16. The demagnification factor can be continuously varied by maintaining a constant mask-sample distance and moving mask-sample combination along converging laser beam 16 between focusing optic 18 and its focal plane, 26. The closer the set mask-sample is located to focal plane 26, the smaller the print size (higher demagnification). The dependence of the demagnification factor on the distance between mask 20 and focal plane 26 is not linear. The demagnification factor increases at a larger rate when the mask is moved closer to the focal plane. Additionally, the demagnification factor has a different dependence for the different Talbot planes. For higher-order Talbot planes, the significant dependence of the demagnification factor on the distance from the focus is observed over a larger range of distances. The distance dependence of the demagnification factor is also influenced by the focal length of focusing optic 18.

In one embodiment, extreme ultraviolet (EUV) laser beams are employed. Because the wavelength of EUV radiation has nano-scale dimensions, embodiments of the invention can be used to print arrays of structures of nano-scale dimensions. The EUV tabletop laser described in the paper by A. Isoyan et al., supra, is highly spatially coherent, and is therefore useful in practicing the invention. The apparatus permits a continuously scalable replication of a periodic mask in the surface of a photoresist, where the resolution of the image on the target is defined by:

$$\Delta_n = \frac{\lambda}{2}\sqrt{1 + \left(\frac{2np^2}{\lambda W}\right)^2},$$

where W is the size of the Talbot mask (in units of length), n is the Talbot plane order, p is the periodicity (in units of length) of the tiling in the mask and $\lambda$ is the wavelength of illumination.

Figure 2:
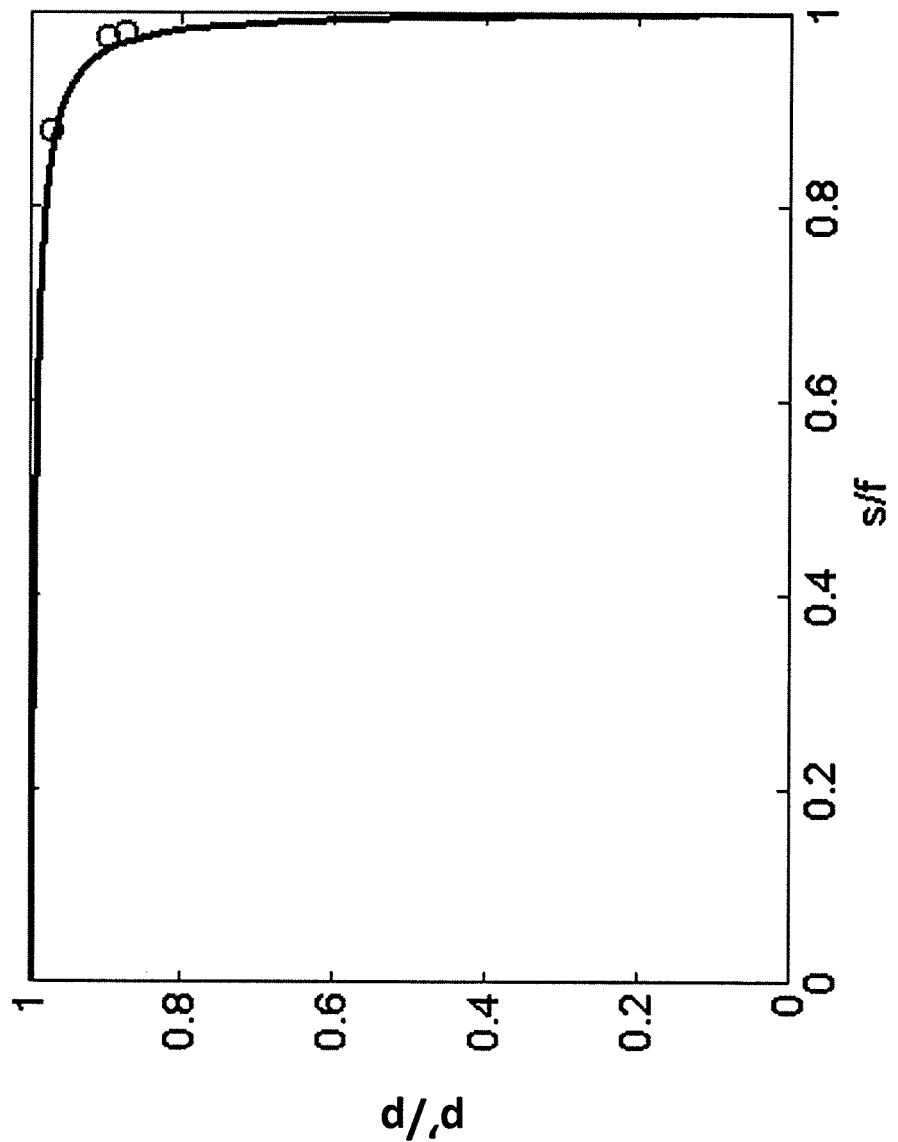
FIG. 2 is a graph of the calculated demagnification factor p'/p as a function of the distance from the focusing mirror to the Talbot mask divided by the focal length of the focusing mirror, the circles showing experimental results using the apparatus illustrated in FIG. 1, hereof.

The demagnification factor can be calculated with the following expression:

$$\frac{p'}{p} = \frac{z}{f-s},$$

where p' is the periodicity of the tiling in the target, z is the distance between the target and the focal plane, f is the focal distance of the focusing element (lens or mirror) and s is the distance between the focusing element and the mask (FIG. 1). The demagnification factor depends strongly on the distance s as it approaches the focal length f. A plot of the calculated de-magnification factor p'/p with the three experimental results indicated as circles is shown in FIG. 2. With the distance between the mask and the target being held constant, as shown in FIG. 1, as s/f approaches unity, p'/p, falls steeply. The slope of this decline becomes less steep when the target is placed at higher order Talbot planes (although using higher order Talbot planes decreases the resolution).

The possibility of printing a reduced (demagnified) image relaxes the requirements in the fabrication of the mask. Not only does demagnification mean that the feature sizes on the mask do not have to be as small as the feature sizes desired on the target, but the unit cell averaging eliminates or at least substantially reduces the number of mask defects transferred onto the target. The resolution that can be achieved with this technique is dictated by the numerical aperture of the exposure apparatus. Laser noise is unimportant since the intensity of the laser is much greater than the background. Further, by adjusting the laser dose, one can print only that portion of the light than derives from the laser, whereby the background light is insufficient to activate the photoresist.

Photoresist exposure time, laser power and other parameters necessary for effective photolithographic printing will be determined by factors such as the photoresist used and the requirements of the user. As an example, using a 46.9 nm capillary discharge laser for the illumination and HSQ as the photoresist, it is necessary to apply at least 14 mJ/cm$^2$ in order to begin the photolithographic activity (See, e.g., "Nanoscale patterning in high resolution HSQ photoresist by interferometric lithography with table top EUV lasers," by P. W. Wachulak et al., Journal of Vacuum Science and Technology B25 (6), 2094, (2007)). This dose is approximately a factor of 5 smaller than that required for using PMMA as the photoresist.

Although the invention disclosed herein contemplates applications including photolithography, the invention may be generalized to accommodate any specific photolithographic procedures that those skilled in the art will already be familiar with. Another advantage of this nanopatterning technique is that because these unit cells are replicated many times in the plane of the mask, any defect in any of the unitary cells is averaged over the very large numbers of tiles in the mask. The area of the defect is thus negligible as compared with the area of the mask consequently generating a virtually defect-free image on the target placed on a Talbot plane.

Having generally described the invention, the following EXAMPLE provides greater detail.

EXAMPLE

Figure 3:
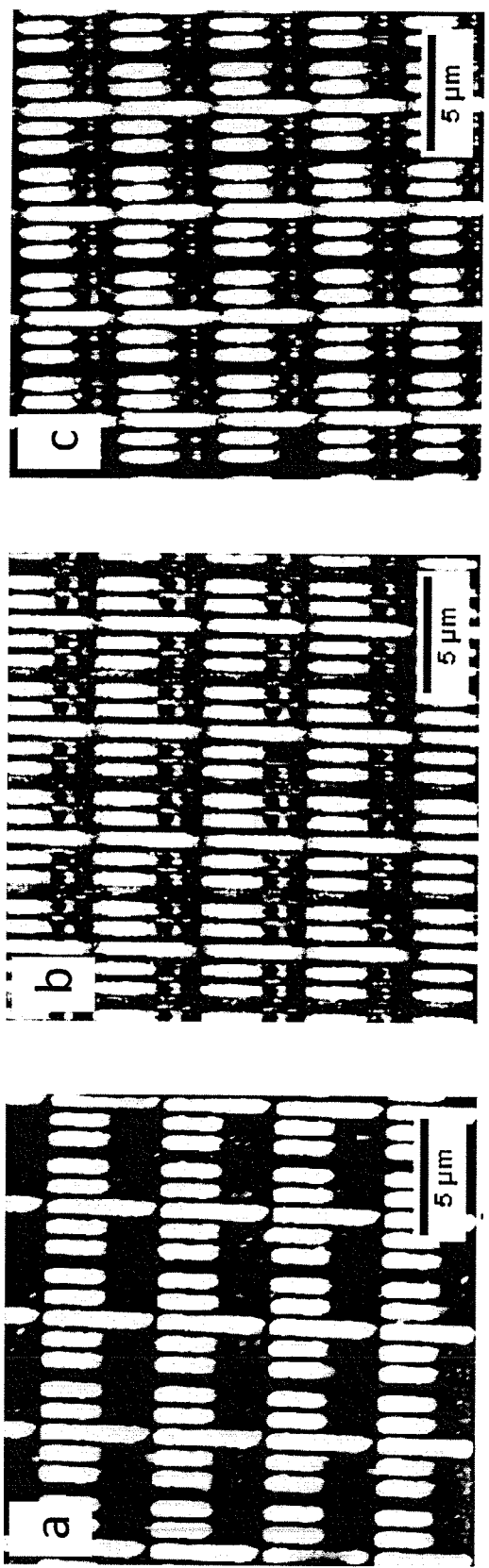
FIG. 3 shows atomic force microscope scans of printed features obtained using different demagnifications (p'/p); 0.98 (scan a), 0.887 (scan b) and 0.865 (scan c), corresponding to the three data points (circles) plotted in FIG. 2 hereof.

A tabletop extreme ultraviolet (EUV) capillary discharge laser emitting at 46.9 nm, the operation of which is described in C. D. Macchietto et al., "Generation of millijoule-level soft-x-ray laser pulses at a 4-Hz repetition rate in a highly saturated tabletop capillary discharge amplifier," Optics Letters. 24, (1999), pages 1115-1117, was utilized as the light source in the apparatus of FIG. 1, hereof. The EUV laser beam was reflected by a spherical mirror with a focal length of 25 cm and a reflectivity of approximately 40% (using a multi-layered silicon/scandium coating) that simultaneously serves as wavelength filter and produces a convergent illumination beam. The Talbot mask and a Si wafer coated with PMMA were disposed in the converging light beam. The Si wafer was separated from the Talbot mask by a distance corresponding to the first Talbot plane, and the mask-sample combination was located along the path of the converging beam at chosen distances from the focusing optic. The sample was exposed with 200 laser shots, each one having an average energy of 300 µJ. Focusing the light beam provides the advantage of increasing the energy density deposited in the sample; however, focusing compromises the spatial coherence of the illumination which has a detrimental effect on the resolution of the printing. FIG. 3 shows atomic force microscopy scans of different prints obtained with the target at 22 cm, 24.4 cm and 24.5 cm from the mirror showing the de-magnification factors p'/p of: 0.98 (scan a), 0.887 (scan b) and 0.865 (scan c), respectively, corresponding to the three data points (circles) plotted in FIG. 2 hereof.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Apparatus for producing nanometer-scale patterning on the surface of a sample, comprising:
    a light source for generating a coherent light beam having a chosen wavelength
    a focusing optic into which the light beam from said light source is directed, for causing the light beam emerging therefrom to converge; and
    a Talbot mask having a periodic pattern of nanometer-scale unit cells formed thereon, said Talbot mask disposed in the converging light beam from said focusing optic at a first chosen distance from said focusing optic such that the converging light beam passes therethrough; the sample being disposed at a second chosen distance from said Talbot mask and having a photosensitive surface thereon responsive to the light beam passing through said Talbot mask, for generating a nanostructure having the pattern of unit cells of said Talbot mask on said sample.

2. The apparatus of claim 1, wherein the second chosen distance is the distance of the first Talbot plane.

3. The apparatus of claim 2, wherein the second chosen distance is one-fourth or three-fourths of the distance of the first Talbot plane.

4. The apparatus of claim 1, wherein the first chosen distance is the distance at which a chosen demagnification of the pattern of arrays of unit cells occurs.

5. The apparatus of claim 1, wherein said focusing optic comprises a mirror.

6. The apparatus of claim 1, wherein said light source comprises an extreme ultraviolet laser.

7. The apparatus of claim 1, wherein said photosensitive surface comprises a photoresist.

* * * * *